United States Patent [19]

Hurle et al.

[11] 4,258,003
[45] Mar. 24, 1981

[54] AUTOMATIC CONTROL OF CRYSTAL GROWTH

[75] Inventors: Donald T. J. Hurle; Gordon C. Joyce, both of Malvern, England

[73] Assignee: National Research Development Corporation, London, England

[21] Appl. No.: 746,631

[22] Filed: Dec. 1, 1976

Related U.S. Application Data

[63] Continuation of Ser. No. 562,670, Mar. 27, 1975, abandoned.

[30] Foreign Application Priority Data

Apr. 3, 1974 [GB] United Kingdom ............... 14885/74
Aug. 16, 1974 [GB] United Kingdom ............... 36288/74

[51] Int. Cl.³ ............................................. C30B 15/28
[52] U.S. Cl. ................................. 422/109; 156/601; 422/249
[58] Field of Search ......................... 156/601, 617 SP; 23/273 SP; 422/249, 108, 109

[56] References Cited

U.S. PATENT DOCUMENTS

| | | | |
|---|---|---|---|
| 2,908,004 | 10/1959 | Levinson | 156/617 SP |
| 3,621,213 | 11/1971 | Jen | 156/601 |
| 3,822,111 | 7/1974 | Suzuki | 156/601 |
| 3,922,527 | 11/1975 | Witkin | 156/601 |
| 3,934,983 | 1/1976 | Bardsley | 156/601 |

OTHER PUBLICATIONS

Bardsley et al., J. of Cryst. Growth, 24/25, (Mar. 1974), pp. 369–373.
Bardsley et al., J. of Cryst. Growth, 16, 1972, pp. 277–279.

Primary Examiner—Hiram Bernstein
Attorney, Agent, or Firm—Cushman, Darby & Cushman

[57] ABSTRACT

In crystal growing apparatus in which a crystal is vertically pulled from an electric heated melt the weight of the crystal is measured by a load cell whose output is compared with an expected function to form a control loop for controlling heater power, the improvement comprises a correction circuit for applying to the control loop a signal compensating for a time differential ($\lambda\text{\AA}$) of an error signal in the load cell output. The correction circuit may be a feedback or a feed forward loop.

7 Claims, 5 Drawing Figures

AUTOMATIC CONTROL OF CRYSTAL GROWTH

This is a continuation of application Ser. No. 562,670 filed Mar. 27, 1975, now abandoned.

This invention relates to apparatus for the growing of crystals from a melt in which measurement of the crystal weight is used to automatically control the crystal cross section.

A technique for growing crystals known as the vertical pulling or Czochralski process comprises pulling a single crystal of material from a melt of the material. The melt is established by heating material in a crucible with radio frequency (R.F.) or resistive power from heater coils surrounding the crucible; a single seed, attached to a vertical pulling rod, is dipped into the melt then slowly raised and rotated. Providing the correct temperature distribution is maintained in the melt and the pulling and rotational speeds are suitable a single crystal will be pulled from the melt. Varying the temperature of the melt, or varying the pulling and rotational speed will vary the crystal cross-sectional area.

It is highly desirable that the crystal shape should be accurately controlled. Frequently the requirement is for a pulled crystal to have uniform cross-section along its length since this provides maximum volume of crystal for subsequent slicing to make semiconductor devices. It is quite simple to provide adequately steady pulling and rotational speeds of the pulling rod but much more difficult to provide the correct temperature at all times during pulling of the crystal. The reasons for this include fluctuation of power into the RF heater coils, movement of the surface of the melt as the crystal grows, and sensitivity of a growing crystal to very small temperature changes.

In a known system the pull rod is suspended from a load cell which measures the growing weight of the crystal and since for uniform cross-sectional area of crystal the increase in crystal weight will be linear the load cell output can be compared with a linearly increasing reference voltage and any difference used to apply a correcting signal to the power supply to the melt. Alternatively the time derivative of the load cell output, which is constant for uniform crystal cross-section is compared with a fixed reference voltage and the difference used to control heater power supply. During initial growth from the single seed the reference voltage is gradually adjusted to its final value corresponding to the desired crystal section.

These known systems have satisfactorily grown crystals of material that are denser in the solid than in the liquid state. However attempts to grow crystals of materials which do not completely wet their solids and/or are denser when molten (as with group IV and III–V semiconductors) have been troubled by instabilities in the servo loops controlling crystal growth.

According to this invention in a crystal pulling apparatus wherein a single crystal may be pulled from a melt heated by electrical power, a control loop is formed by comparing the weight of a growing crystal measured by a load cell with an expected function to form a control signal for controlling the power applied to the heater, and a correction circuit is formed to extract a signal from the control loop to process such extracted signal and to feed into the control loop a signal containing a signal compensating for $-\lambda\dot{a}$ as herein defined in the load cell output.

The correction circuit may be a feedback loop in which a signal is extracted and either differentiated once or twice and fed back into the control loop to compensate for either $-\lambda\dot{a}$ or $(\eta a - \lambda\dot{a})$ as hereinafter defined in the load cell output.

The output of the load cell may be differentiated and compared with a constant reference voltage, alternatively the output of the load cell may be compared with a gradually increasing reference voltage.

When the output of the load cell is differentiated the feedback loop is arranged to add to the differentiator output a signal of the form $-c\ddot{a}$ or $b\dot{a}-c\ddot{a}$ where b and c are constants.

When the output of the load cell is compared with a gradually increasing reference voltage the feedback loop adds to the load cell output a signal $-c\dot{a}$, or $ba-c\dot{a}$.

A phase advance network may be arranged in the control loop to compensate for thermal lags in the heater and melt. Also simulated thermal lag may be arranged in the feedback loop.

The feedback loop may include circuitry for compensating for the manner in which changes in crystal cross-section vary with changes in heater power.

The correction circuit may alternatively be a feed forward loop in which the extracted signal is either differentiated once or twice and added into the control loop to compensate either for $-\lambda\dot{a}$ or $\eta a - \lambda\dot{a}$ in the load cell output. Such a feed forward loop generates higher order differentials of 'a', but such differentials are insignificant for some crystal pullers.

The invention will now be described by way of example only with reference to the accompanying drawings in which.

The forces experienced by a weighing cell during crystal growth consist of the constant weight of pull rod, the (solid) crystal itself, and contributions arising from surface tension of the melt and the meniscus supported by the growing crystal. The weight of the crystal itself will ideally increase linearly with time, i.e. when its effective radius r remains constant. However if the effective radius r changes by an amount a then the weight measured by the load cell will be in error.

It can be shown that the weight error $\delta W$ due to a change a in radius r measured by the load cell is given by $$\beta\delta W = \int_0^t adt + \eta a - \lambda\dot{a}$$

where $\beta$, $\eta$ and $\lambda$ are constants assuming $a=\dot{a}=o$ at time $t=o$. The error in weight after a given time t is proportional to the integrated error in the radius plus a term proportional to the actual error and a term proportional to its time derivative. These last two terms $\eta a-\lambda\dot{a}$ have previously been ignored when growing crystals. However for the materials which are denser in the liquid than solid state and/or do not completely have complete solid-melt wetting ($\theta_L^o > 0$) $\lambda > 0$, the term $-\lambda\ddot{a}$ cannot be ignored since it introduces instabilities into a servo controlled system.

It can be shown that $$\lambda = (A/v^2)\sin\theta_L^o + (B/v^2)(\rho_L - \rho_s) \text{ and } \eta = C/v$$

where v is crystal growth velocity
A, B and C are positive constants for a given material and given crystal radius
$\theta_L^o$ is the angle made to the crystal by the meniscus at the point of contact with the crystal.
$\rho_L$ is density of liquid material
$\rho_s$ is density of solid material.

The weight W measured by the load cell notionally comprises two components, the weight w corresponding to growth at constant radius (r) and the weight $\delta W$ corresponding to an error (if any) of crystal radius.

Figure 1:
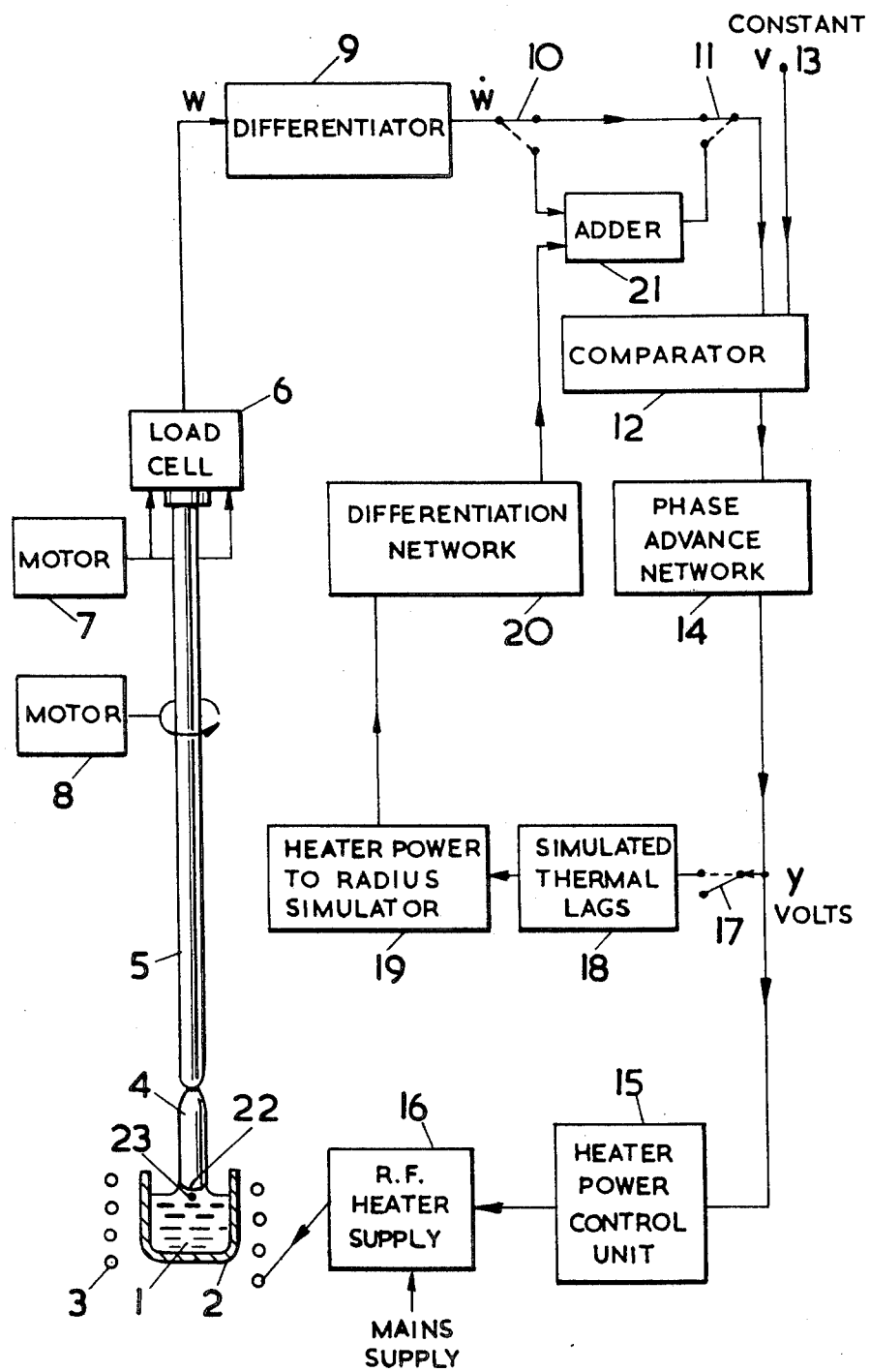
FIG. 1 is a diagrammatic representation of a crystal growing apparatus.

FIG. 1 shows diagrammatically an automatic crystal pulling apparatus. Material 1 to be pulled is contained in a crucible 2 surrounded by RF or resistive heater coils 3. A crystal 4 being pulled is attached to the bottom of a vertical pull rod 5 which is suspended from a load cell 6. The pull rod 5 is rotated by an electric motor 7, and axially movable by another electric motor 8 through gearing (not shown) e.g. a lead screw and nut gearing. Electrical output from the load cell 6 passes through a differentiator 9 and two switches 10, 11 into a comparator 12 where it is compared with a fixed reference voltage 13. Output from the comparator 12 is passed through a phase advance network 14 into a power control unit 15 for controlling the power output of an RF heater unit 16 which supplies power to the heater coils 3. The load cell 6, differentiator 9, comparator 12, phase advance network 14 and power control unit 15 form part of the control loop.

The phase advance network 14 may be constructed in a known way from one or more analogue phase advance circuits consisting for example of a first resistor in parallel with a capacitor and a second resistor followed by an operational amplifier in parallel with a third resistor.

The output of the phase advance network 14 may also be connected through a switch 17 to a feedback loop comprising, in series, a simulated thermal lag circuit 18, a heater power to radius simulator 19, a differentiation network 20, to one input of an adder 21. The other input terminal of the adder 21 is connected to the switch 10 and the output of the adder 21 is connected to the switch 11.

As already described above, error in a growing crystal diameter will give rise to an error signal $\delta W$. Generally then, the output W of load cell will notionally comprise $\delta W + w$, where w is the weight of a uniform cross section crystal.

In operation with the switches in 10, 11, 17 in the positions shown in FIG. 1 i.e. with the feedback loop unconnected, a crystal 4 is slowly grown from the melt. Output W from the load cell 6 is differentiated in the differentiator 9 to form $\dot{W}$ which is compared in the comparator 12 with a fixed reference voltage 13. Any output from the comparator 12 represents an error in the crystal growth and is fed through the phase advance circuit 14 to the power control unit 15 to modify the power supply 16 to the heater 3. The phase advance network 14 modifies the control signal to compensate for thermal lags in the heater 3 and melt 1. When growing crystals having a solid density greater than liquid density and where the crystal is completely wetted by the solid this automatic control of crystal growth is adequate.

However as already noted, for a material where the liquid density is greater than its solid density and/or the melt does not completely wet the solid the term $\lambda\ddot{a}$ in the signal from the load cell (i.e. the term $\lambda\ddot{a}$ from the differentiator 9) causes instability.

Figure 2:
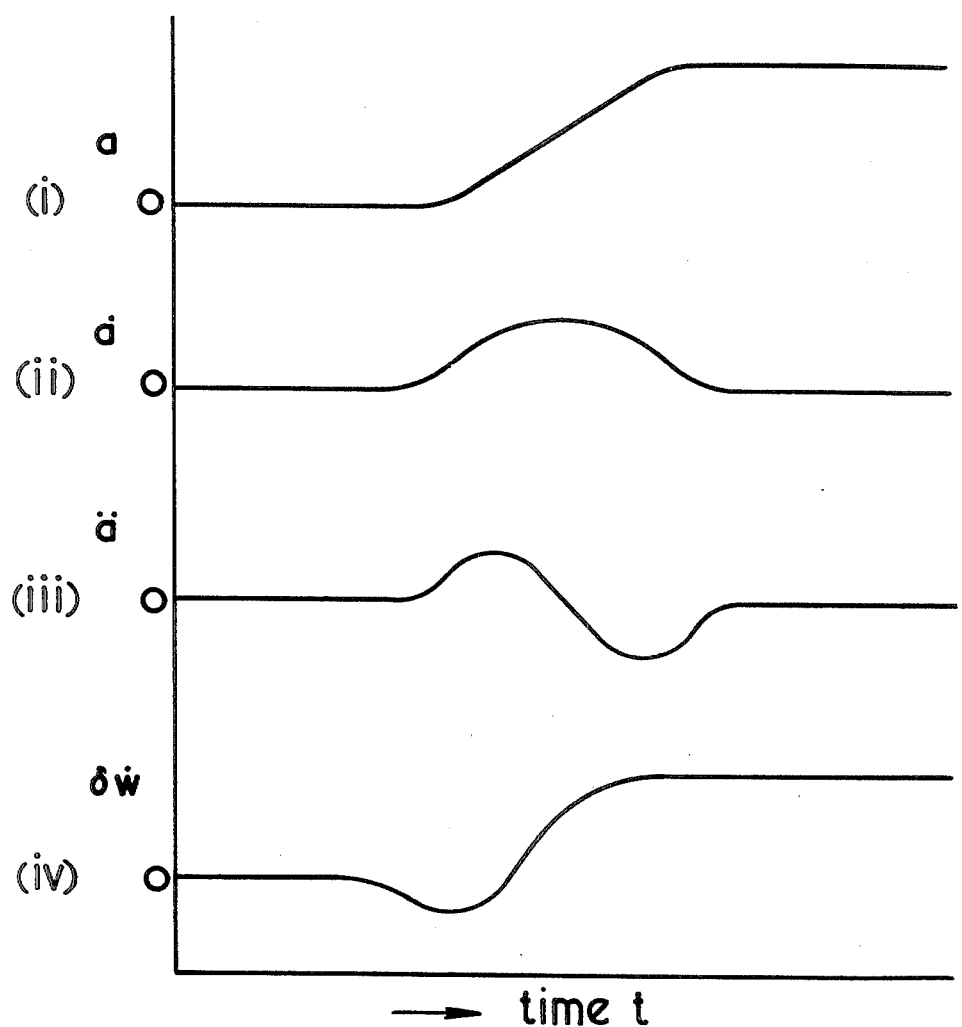
FIG. 2 are graphs showing functions of a crystal weight.

The cause of instability can be seen by examination of the graphs shown in FIG. 2. If the radius of a growing crystal departs from a constant radius by increasing r then the radius error 'a' changes as shown in FIG. 2(i). It can be shown that the time differential of a namely $\dot{a}$ varies as shown in FIG. 2(ii) whilst the second time differential $\ddot{a}$ varies as shown in FIG. 2(iii); the error signal $\delta\dot{W}$ will vary as shown in FIG. 2(iv) for sufficiently rapid changes in a. The error signal $\delta\dot{W}$ during a change in crystal radius has an initial value which is opposite to that which is correctly required to provide a control signal to the power control unit 15.

The reason for the shape of the $\delta\dot{W}$ curve can be found by considering the interface 22 between solid 4 and liquid 1 in the crucible 2. Assume that a sudden decrease in power is applied to the heater 3. This causes a decreased temperature in the crucible 2, and the interface 22 between the cooler crystal 4 and hotter melt 1 will fall, i.e. producing an enhanced growth rate. By solidifying a portion of the liquid meniscus 23 supported by the crystal, a volume of melt has been replaced by an approximately equal volume of solid, which is less dense. The rate of increase of weight recorded by the load cell is therefore less than it would otherwise have been, i.e. $\delta\dot{W}$ is negative. After some new and larger radius has been finally established the meniscus returns approximately to its original position and $\delta\dot{W}$ becomes positive because of the increased area of crystal interface. An additional effect is produced by surface tension. As the meniscus height decreases and the crystal begins to grow out to its new, larger, radius, the surface tension force acting around the periphery of the crystal at the crystal-melt boundary becomes directed further away from the vertical (i.e. $\theta_L^o$ increases). Consequently the vertical component of the tension which is experienced by the load cell is diminished and this also contributes a negative component to $\delta\dot{W}$ initially. When the new radius is established and the crystal is again growing with a cylindrical shape, $\theta_L^o$ returns to its original value.

To overcome these instability problems it is necessary to compensate for the $\lambda\ddot{a}$ terms in the signal from the load cell, and in some circumstances to compensate for the $\eta\dot{a}$ term.

This is achieved by operating the switches 10, 11, 17 of FIG. 1 so that the output from the differentiator 9 is fed through the adder 21 to the comparator 12 and the output of the phase advance network 14 is also fed to the simulated thermal lag network 18, i.e. as shown by broken lines. Operation when growing a crystal is then as follows: Output W from the load cell 6 will notionally comprises error weight $\delta W$ and weight w, the signal Y required to be fed into the power control unit is proportional to 'a' the radius error. The output $\dot{W}$ of the differentiator i.e. $\delta\dot{W} + \dot{w}$, contains the terms $\eta\dot{a} - \lambda\ddot{a}$ and therefore the signal from the differentiation network 20 must be of the form $b\dot{a} - c\ddot{a}$ where b and c are suitable constants. These terms are provided by taking the output of the phase advance network 14 through simulated lags 18 into the differentiation network 20 where the signal is differentiated once to provide bȧ, and differentiated again to provide cä. Thus the adder combines Ẇ (which includes ηȧ−λä) and bȧ−cä to give an output to the comparator free of the a−ä terms, i.e. the expected constant crystal differentiated weight plus the error weight signal. The comparator output will be the wanted signal corresponding to the error in radius, and is used to control the correct power into the heater 3. The constants b and c are empirically or by calculation adjusted to be equal to η and λ. They are functions of growth rate; and to a lesser extent on the required radius. In the circumstances where compensation for ηȧ is not required the constant b is zero, and the output of the differentiation network 20 is −cä.

As previously noted the phase advance network is arranged to compensate for thermal lags, i.e. the time between a change in power to the heater 3 and the time the melt adjacent to the crystal-melt interface 22 changes its temperature.

It has been found that the thermal delay times may be represented by the equation $$T(s) = \frac{1}{1+sT_1} \cdot \frac{1}{1+sT_2} \cdots \frac{1}{1+sT_n}$$

where $T_1$, $T_2$, $T_n$ are constants determined from a previous calibration of the apparatus and where s is the Laplace operator. The terms on the right hand side of this equation may be separately compensated for by separate conventional phase advance networks arranged in sequence.

With large crystal growing apparatus the thermal lags become significant and must be allowed for, except where only very slow growth rates are employed.

To provide a correct signal for feeding into the differentiation network 20, the output from the phase advance network 14 must be phase retarded by an amount corresponding to the thermal lags in the power control unit 15, R.F. heater supply 16, heater 3, and crucible 2; this is achieved in the simulated thermal lag network. Such lags are easily simulated by conventional phase delay networks. For example a phase delay may be arranged by feeding a signal through a resistor and d.c. amplifier in series, the d.c. amplifier having connected between its input and output a resistor and capacitor in parallel.

For smaller crystal growing apparatus with correspondingly small thermal lags the phase advance, and simulated thermal lag networks may be dispensed with.

With some equipment the phase advance network 14 may very accurately compensate for the actual phase lags in the crucible 2, etc. In such circumstances the switch 17 may be connected to the input of the network 19 (as opposed to the output as shown) and the simulated thermal lags 18 dispensed with.

When power is applied from the heater unit 16 to the heater coils 3, power is dissipated in the melt 1 and crucible 2. It is thus desirable to determine the relationship between incremental power supplied $\delta P_s$ to the heater, the effective power change $\delta P_e$ into the melt adjacent to the interface 22, and also the relation between $\delta P_e$ and changes in crystal radius a. $\delta P_e$ is directly proportional to $\delta P_s$, but with a time delay due to the thermal lags.

It has previously been assumed that $\delta P_e$ is proportional to 'a' (change in crystal radius). However this description is inadequate under some growth conditions and use of a more general relationship of the form:

$$\delta P_e = ka + l\dot{a} + m\ddot{a}$$

where k, l, m are constants, is required.

To compensate for this feedback loop may contain the heater power to crystal radius simulator 19 which simulates the value of 'a' which corresponds to a given time variation of $\delta P_e$. The input to the simulator 19 is proportional to $\delta P_e$, its output is arranged to be proportional to a.

The above description with reference to FIG. 1 compared the time differential Ẇ of load cell 6 output with a fixed reference voltage 13 to obtain a signal for applying the power control 15.

In a modification (not shown) the load cell 6 output W is compared with the output of a linear potentiometer whose slider is connected to move vertically with the pull rod. Thus for a uniform cross sectional crystal the gradually increasing weight of crystal would exactly match the gradually increasing output of the linear potentiometer. The load cell differentiator 9 of FIG. 1 is not required, and the load cell 9 is connected through switches 10, 11 to one side of the comparator 12. The constant voltage source 13 is replaced by the linear potentiometer. Output from the load cell 6 is W (which includes the terms ηa−λȧ) and this must be compensated for. The differentiation network 20 is therefore arranged to provide an output bȧ−cä into the adder 21. Any error in crystal growth, i.e. the comparator 12 output (proportional to $\int adt$) is fed into the power control unit 15. Since this error signal is an integral it contains the past history of the crystal growth. Thus an increase in the crystal diameter is compensated for by a subsequent, short length, reduced diameter portion of crystal. However, for very slow growth rates where the differentiator 9 of FIG. 1 is unsatisfactory (poor signal/noise output) the use of a linear potentiometer comparison is useful. As previously noted the term ηa may not require compensation, in which case the constant b would be zero i.e. the output of the differentiation network 20 is −cä.

Figure 3:
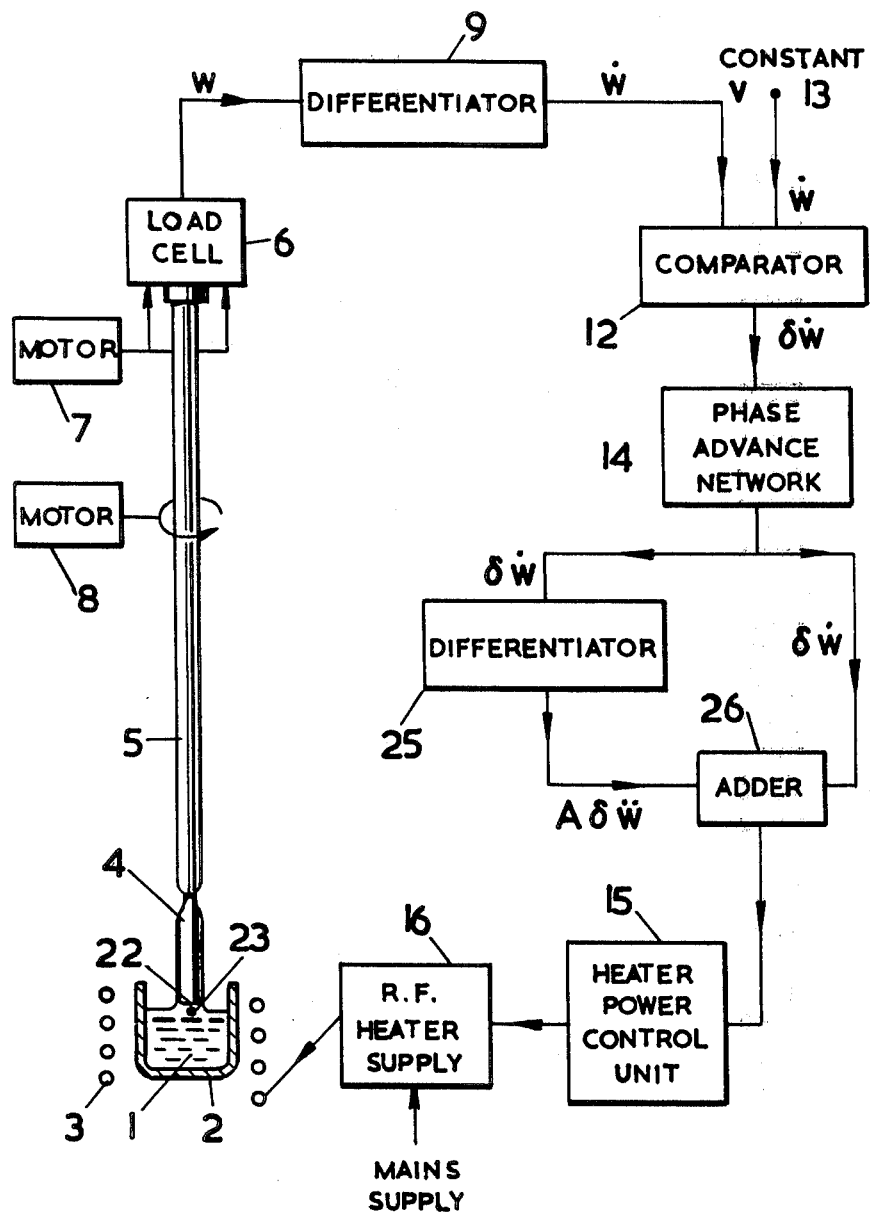
FIG. 3 is an alternate form of the invention.

FIG. 3 shows diagrammatically an alternative form of the invention having identical components to those in FIG. 1 and therefore identified by the same reference characters. A crystal 4 is attached to a pull rod 5 and pulled from a melt 1 held in a crucible 2 heated by a heater 3. Motors 7 and 8 move the rod 5 axially and rotationally. Weight of the crystal 4 is measured by a load cell 6 whose output passes through a differentiator 9 to one input of a comparator 12. A second input to the comparator 12 is a voltage V. Output from the comparator 12 is fed through a phase advance network 14 and then both directly to one input of an adder 26 and also through a further differentiator 25 to another input of the adder 26. Output from the adder 26 is fed to a heater power control unit 15 which controls a heater supply unit 16.

As previously noted output W from the load cell 6 comprises δw+w and the δw term is proportional to $\int adt + \eta a - \lambda \dot{a}$. The instabilities noted previously are prevented by adding to the control loop (i.e. the circuitry between the load cell 6 and heater supply 16) a term equal and opposite to $-\lambda \dot{a}$ in the following manner.

Output W from the load cell 6 is differentiated in the differentiator 9 to form Ẇ and is compared with V in the comparator 12; for constant crystal diameter $V=w$ and the output of the comparator 12 is $\delta\dot{w}$. This signal $\delta\dot{w}$ is differentiated in differentiator 25 to form a term proportional to $\delta$ and is added to $\delta\dot{w}$ in the adder 26. The adder 26 then adds $a+\eta\dot{a}-\lambda\ddot{a}$ to $Aa+\eta A\dot{a}-\lambda A\ddot{a}$ where A is a constant. By suitable adjustments $-\lambda\ddot{a}$ can be made equal to $\eta A\ddot{a}$. The adder 26 output is thus proportional to $a+(A+\eta)\dot{a}-\lambda A\ddot{a}$ which is used by the heater control unit 15 to adjust heater 3. For some crystal pullers the terms $(A+\eta)\dot{a}-\lambda A\ddot{a}$ can be ignored since they may not cause instability.

Figure 4:
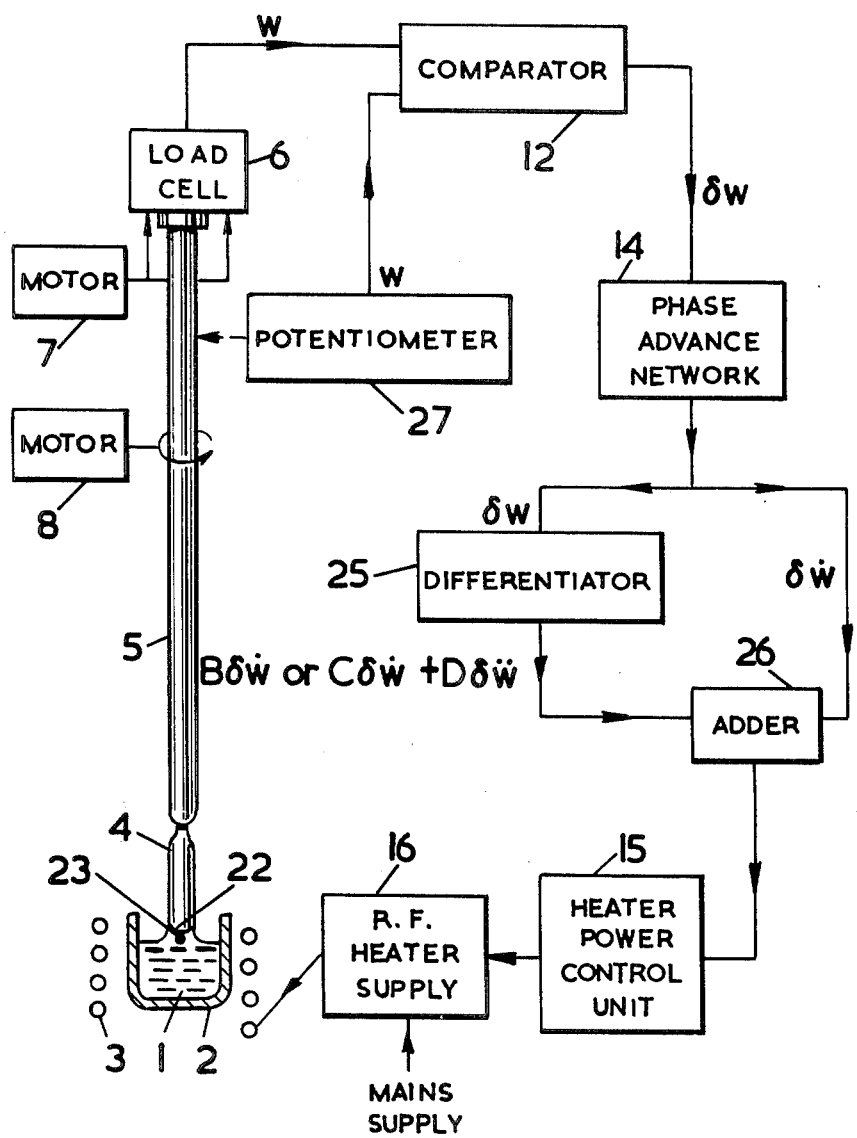
FIG. 4 is a modification of the apparatus shown in FIG. 3.

FIG. 4 is a modification of FIG. 3 with identical components given like reference characters. Instead of the load cell 6 output being compared with a constant voltage V it is compared with a ramp voltage Vr obtained from the slider of a linear potentiometer 27; the slider being connected to and moveable with the pull rod 5. The output from the comparator 12 may be differentiated once, or alternatively, twice in the differentiator 25.

In operation output W from the load cell 6 is compared with Vr in the comparator 12. For constant crystal diameter $Vr=w$. The output of the comparator is $\delta w$ which is proportional to $\int adt+\eta a-\lambda\dot{a}$. The signal $\delta w$ is differentiated to form a term proportional to $\delta\dot{w}$ in the differentiator 25 and is added to $\delta w$ in the adder 26 whose output is $\delta w+B\delta\dot{w}$, i.e. $\int adt+\eta a-\lambda\dot{a}$ is added to $Ba+\eta B\dot{a}-\lambda B\ddot{a}$ (when B is a constant).

For compensation of instabilities $\eta B\dot{a}=-\lambda\dot{a}$, i.e. the adder 26 output is proportional to $\int adt+(B+\eta)a-\lambda B\ddot{a}$ which contains the required signal $\int adt$ for control of the heater power. Alternatively the output $\delta w$ from the comparator 12 is differentiated twice to form terms proportional to $\delta\dot{w}$ and $\delta$ and added to $\delta w$, i.e. added to $\int adt+\eta a-\lambda\dot{a}$ are $Ca+C\eta\dot{a}-C\lambda\ddot{a}$ plus $DC\dot{a}+\eta DC\ddot{a}-\lambda DC\dddot{a}$. For the control of instabilities $-\lambda\dot{a}=(C\eta+DC)\dot{a}$, and for some crystal pullers it is desirable that $\eta a=-Ca$.

The output of the adder 26 is thus $\int adt+Ea+-G\ddot{a}+H\ddot{a}$ where C, D, G and H are constants, and E may equal zero. It can be seen that the adder 26 output contain terms in $\ddot{a}$ and $\ddot{a}$ but these higher orders differentials do not, in some crystal pullers, cause instability.

For some crystal pullers however, it has been found that the higher differentials of the quantity 'a' affect stability and therefore the arrangement shown in FIG. 1 must be used so that the input to its heater power control unit 15 contains the term a or $\int adt$.

Compensation for thermal lags in the heater 3 and melt 1 may be compensated for by a phase advance network 14 arranged in the control loop between the adder 26 and heater power control unit 15 of FIGS. 3 and 4.

Figure 5:
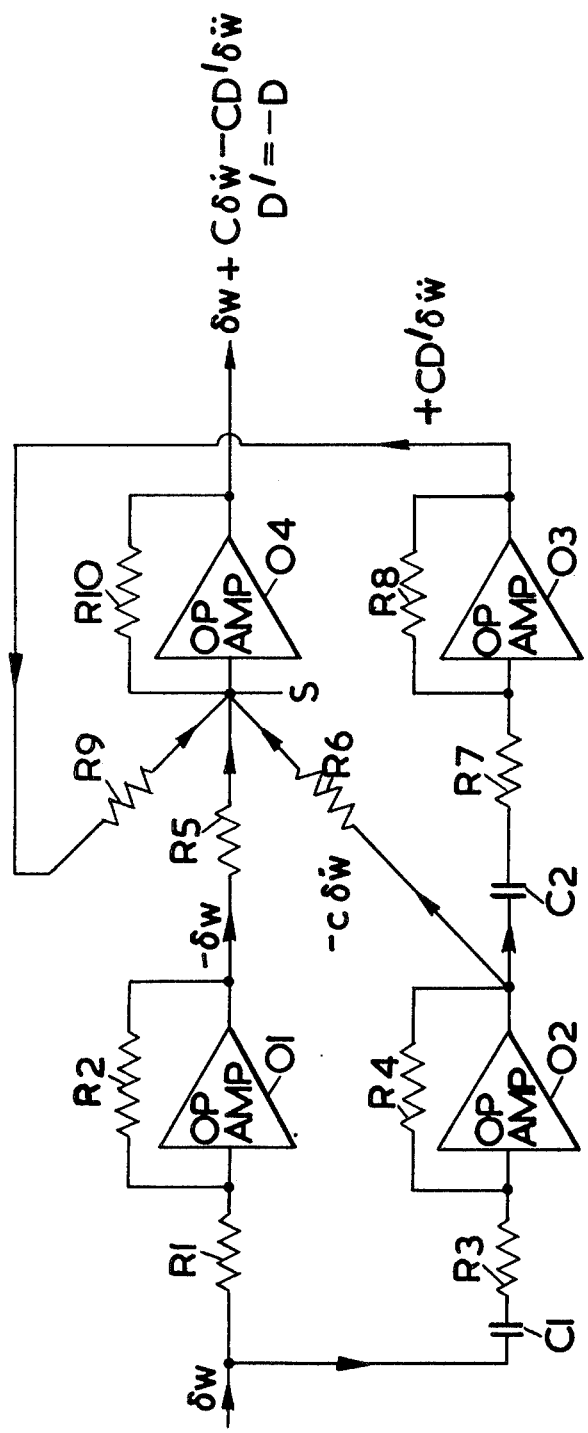
FIG. 5 shows one form of differentiator for use in the apparatus shown in FIG. 4.

A circuit for providing terms proportional to $\delta\dot{w}$ and $\delta$ in the control loop 25, i.e. one form of the differentiator 25, is shown in FIG. 5. The error signal $\delta w$ from the comparator 12 is first fed to a resistor R1 in series with an operational amplifier 01 having a resistor R2 connected between its input and output terminals and to capacitor C1 in series with a resistor R2 and an operational amplifier 02 having a resistor R4 connected between its input and output terminals. The output of the operational amplifiers 01 and 02 are respectively fed to a common point S through resistors R5 and R6. The output of the operational amplifier 02 is also fed to a capacitor C2 in series with a resistor R7 and an operational amplifier C3 having a resistor R8 connected between its input and output terminals. The output of the operational amplifier 93 is fed through a resistor R9 to the common point S. Finally, the signal at the common point S which consists of three contributions from the operational amplifiers 01, 02 and 03 is fed to an operational amplifier 04 having a resistor R10 connected between its input and output terminals.

The operational amplifiers 01, 02, 03 and 04 all have a negative gain and therefore all reverse the sign of the signal fed into them. The combination of the capacitor C1 and the resistor R4 and the combination of the capacitor C2 and the resistor R8 both act as differentiators and therefore both differentiate the signal fed into them; the latter combination also acts as a second order differentiator to the input to the operational amplifier 02. Resistors R3 and R7 are provided to limit the high frequency gain of the circuit, but must be kept small (not more than one tenth the value of R4 and R8 respectively) so that the output of the circuit is of the desired form. The values of the resistors R1 and R2 are chosen so that the output of the operational amplifier 01 is $-\delta w$. The values of the capacitor C1 and the resistors R3 and R4 are chosen so that the output of the operational amplifier C2 is approximately equal to $-C\delta\dot{w}$ where C is the constant defined above.

The values of the capacitor C2, and the resistors R7 and R8 are chosen so that the output of the operational amplifier 03 has an approximate value $+CD'\delta\dot{w}$ where $-D'$ is the same as $+D$, the constant as defined above. The values of the resistors R5, R6, R9 and R10 are chosen so that the input to the operational amplifier 04 which consists of the contributions $-\delta w$, $-C\delta\dot{w}$ and $+CD'\delta$ is merely reversed in sign by the operational amplifier 04 to provide a final output equal to the function $\delta w+C\delta\dot{w}+CD\delta$ for small values of R3, R7. Preferably the resistors R5, R6 and R9 are adjustable.

In the form shown in FIG. 5 the point S and operational amplifier 04 constitute the adder 26 and the parts of the circuit other than the operational amplifier 01 and resistors R1 and R2 (which merely feed $\delta w$ reversed in sign to the point S) constitute the differentiator 25 of FIG. 4.

The load cell of FIGS. 1, 3 and 4 may be replaced by a load cell arranged to weigh the crucible and its contents, and hence determine crystal weight by subtraction from a starting figure. Compensation for levitation of the crucible due to the RF heating may then be necessary, and may be provided for in a known way.

All operations may be performed by either analogue means as illustrated in FIG. 4 or by digital means.

Using the arrangement shown in FIG. 1 a germanium crystal has been grown applying feedback to compensate for the $\lambda\dot{a}$ term only. The crystal was grown at 3 mm/hour and had a radius of 1 cm. Under this condition the constant $\eta=6.1\times 10^3$ sec and the constant $\lambda=3.6\times 10^6$ sec$^2$.

I claim:

1. In an apparatus for growing crystals comprising:
   a crucible for holding crystal material;
   heaters operatively associated with said crucible to render said material molten;
   a pull rod for pulling a single crystal from the molten material;
   motors for rotating and raising the pull rod at rates related to the temperature of the molten material to produce a crystal having an expected radius;
   a load cell for measuring the weight of said crystal, said cell producing an output which includes an error signal when the radius of the crystal varies from the expected value, said error signal including a component which is a differential of radius variation with respect to time;

an electrical control loop connected between the load cell and said heaters, said loop including a comparator for comparing the output of said cell with voltage from a voltage source to produce a comparator output; and a correction circuit connected to the control loop at a point between the load cell and said heaters, the improvement wherein said circuit comprises:

a differentiation network responsive to the load cell output for producing an output signal which includes a component which is a first differential with respect to time, and means joining said differentiation network output signal to said control loop for adding to the electrical control loop the output from the differentiation network to compensate for said differential of radius variation with time in the load cell output, to reduce said differential of radius variation with time and eliminate instability in said loop.

2. In an apparatus according to claim 1 wherein the output signal from said differentiation network additionally includes a component which is a second differential with respect to time.

3. Apparatus according to claim 1 wherein said control loop further comprises a differentiator located between said load cell and the comparator.

4. Apparatus according to claim 3, wherein said differentiation network output signal is joined to the control loop between the differentiator and the comparator.

5. Apparatus according to claim 4, wherein said correction circuit further includes a phase delay network.

6. Apparatus according to claim 1, wherein said differentiation network output signal is joined to the control loop between said point and the heaters.

7. Apparatus according to claim 1, wherein said electrical loop further includes a phase advance network.

* * * * *